(12) United States Patent
Cheng et al.

(10) Patent No.: US 8,541,883 B2
(45) Date of Patent: Sep. 24, 2013

(54) SEMICONDUCTOR DEVICE HAVING SHIELDED CONDUCTIVE VIAS

(75) Inventors: Hung-Hsiang Cheng, Kaohsiung (TW); Tzu-Chih Lin, Taichung (TW); Chang-Ying Hung, Kaohsiung (TW); Chih-Wei Wu, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 21 days.

(21) Appl. No.: 13/306,762

(22) Filed: Nov. 29, 2011

(65) Prior Publication Data
US 2013/0134601 A1    May 30, 2013

(51) Int. Cl.
*H01L 29/40*    (2006.01)
(52) U.S. Cl.
USPC ........... 257/774; 257/686; 257/773; 257/777; 257/E23.011
(58) Field of Classification Search
USPC ......... 257/686, 773–774, 777; 438/618–624, 438/637–638, 672–673
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,569,786 A | 2/1986 | Deguchi |
| 4,807,021 A | 2/1989 | Okumura |
| 4,814,205 A | 3/1989 | Arcilesi et al. |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,166,772 A | 11/1992 | Soldner et al. |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,353,498 A | 10/1994 | Fillion et al. |
| 5,355,016 A | 10/1994 | Swirbel et al. |
| 5,404,044 A | 4/1995 | Booth et al. |
| 5,557,142 A | 9/1996 | Gilmore et al. |
| 5,615,477 A | 4/1997 | Sweitzer |
| 5,639,989 A | 6/1997 | Higgins, III |
| 5,643,831 A | 7/1997 | Ochiai et al. |
| 5,677,511 A | 10/1997 | Taylor et al. |
| 5,694,300 A | 12/1997 | Mattei et al. |
| 5,776,798 A | 7/1998 | Quan et al. |
| 5,886,876 A | 3/1999 | Yamaguchi |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Dung A. Le
(74) *Attorney, Agent, or Firm* — Morgan Law Offices, PLC

(57) ABSTRACT

The present invention relates to a semiconductor device having a shielding layer. The semiconductor device includes a substrate, an inner metal layer, a shielding layer, an insulation material, a metal layer, a passivation layer and a redistribution layer. The inner metal layer is disposed in a through hole of the substrate. The shielding layer surrounds the inner annular metal. The insulation material is disposed between the inner metal layer and the shielding layer. The metal layer is disposed on a surface of the substrate, contacts the shielding layer and does not contact the inner metal layer. The redistribution layer is disposed in an opening of the passivation layer so as to contact the inner metal layer.

14 Claims, 14 Drawing Sheets

(56) References Cited

U.S. PATENT DOCUMENTS

| | | | |
|---|---|---|---|
| 5,895,229 A | 4/1999 | Carney et al. |
| 5,998,292 A | 12/1999 | Black et al. |
| 5,998,867 A | 12/1999 | Jensen et al. |
| 6,093,972 A | 7/2000 | Carney et al. |
| 6,150,193 A | 11/2000 | Glenn |
| 6,225,694 B1 | 5/2001 | Terui |
| 6,276,599 B1 | 8/2001 | Ogawa |
| 6,329,631 B1 | 12/2001 | Yueh |
| 6,376,769 B1 | 4/2002 | Chung |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,586,822 B1 | 7/2003 | Vu et al. |
| 6,614,102 B1 | 9/2003 | Hoffman et al. |
| 6,670,269 B2 | 12/2003 | Mashino |
| 6,686,649 B1 | 2/2004 | Mathews et al. |
| 6,699,787 B2 | 3/2004 | Mashino |
| 6,740,546 B2 | 5/2004 | Corisis et al. |
| 6,740,950 B2 | 5/2004 | Paek |
| 6,740,959 B2 | 5/2004 | Alcoe et al. |
| 6,757,181 B1 | 6/2004 | Villanueva |
| 6,781,231 B2 | 8/2004 | Minervini |
| 6,812,549 B2 | 11/2004 | Umetsu et al. |
| 6,815,348 B2 | 11/2004 | Mashino |
| 6,828,656 B2 | 12/2004 | Forbes et al. |
| 6,838,776 B2 | 1/2005 | Leal et al. |
| 6,865,084 B2 | 3/2005 | Lin et al. |
| 6,881,896 B2 | 4/2005 | Ebihara |
| 6,962,829 B2 | 11/2005 | Glenn et al. |
| 6,962,869 B1 | 11/2005 | Bao et al. |
| 6,998,532 B2 | 2/2006 | Kawamoto et al. |
| 7,030,469 B2 | 4/2006 | Mahadevan et al. |
| 7,045,385 B2 | 5/2006 | Kim et al. |
| 7,078,269 B2 | 7/2006 | Yamasaki et al. |
| 7,081,661 B2 | 7/2006 | Takehara et al. |
| 7,125,744 B2 | 10/2006 | Takehara et al. |
| 7,134,198 B2 | 11/2006 | Nakatani |
| 7,157,372 B1 | 1/2007 | Trezza |
| 7,161,252 B2 | 1/2007 | Tsuneoka et al. |
| 7,186,928 B2 | 3/2007 | Kikuchi et al. |
| 7,187,060 B2 | 3/2007 | Usui |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,327,015 B2 | 2/2008 | Yang et al. |
| 7,334,326 B1 | 2/2008 | Huemoeller et al. |
| 7,342,303 B1 | 3/2008 | Berry et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,451,539 B2 | 11/2008 | Morris et al. |
| 7,478,474 B2 | 1/2009 | Koga |
| 7,482,272 B2 | 1/2009 | Trezza |
| 7,488,903 B2 | 2/2009 | Kawagishi et al. |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,576,415 B2 | 8/2009 | Cha et al. |
| 7,598,163 B2 | 10/2009 | Callahan et al. |
| 7,605,463 B2 | 10/2009 | Sunohara |
| 7,625,818 B2 | 12/2009 | Wang et al. |
| 7,629,674 B1 | 12/2009 | Foster |
| 7,633,170 B2 | 12/2009 | Yang et al. |
| 7,633,765 B1 | 12/2009 | Scanlan et al. |
| 7,642,132 B2 | 1/2010 | Huang et al. |
| 7,643,311 B2 | 1/2010 | Coffy |
| 7,656,023 B2 | 2/2010 | Sunohara et al. |
| 7,656,047 B2 | 2/2010 | Yang et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,700,411 B2 | 4/2010 | Yang et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,745,910 B1 | 6/2010 | Olson et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang et al. |
| 7,829,981 B2 | 11/2010 | Hsu |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0020673 A1 | 2/2004 | Mazurkiewicz |
| 2004/0124518 A1 | 7/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2004/0259292 A1 | 12/2004 | Beyne et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0189635 A1 | 9/2005 | Humpston et al. |
| 2005/0208702 A1 | 9/2005 | Kim |
| 2005/0258545 A1 | 11/2005 | Kwon |
| 2006/0001174 A1* | 1/2006 | Matsui ..................... 257/774 |
| 2006/0027632 A1 | 2/2006 | Akram |
| 2006/0145361 A1 | 7/2006 | Yang et al. |
| 2006/0197216 A1 | 9/2006 | Yee |
| 2006/0266547 A1 | 11/2006 | Koga |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0042301 A1 | 2/2008 | Yang et al. |
| 2008/0061407 A1 | 3/2008 | Yang et al. |
| 2008/0174013 A1 | 7/2008 | Yang et al. |
| 2008/0272486 A1 | 11/2008 | Wang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0032928 A1 | 2/2009 | Chiang et al. |
| 2009/0035895 A1 | 2/2009 | Lee et al. |
| 2009/0039527 A1 | 2/2009 | Chan et al. |
| 2009/0102003 A1 | 4/2009 | Vogt et al. |
| 2009/0102033 A1 | 4/2009 | Raben |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0243045 A1 | 10/2009 | Pagaila et al. |
| 2009/0256244 A1 | 10/2009 | Liao et al. |

| | | |
|---|---|---|
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0059855 A1 | 3/2010 | Lin et al. |
| 2010/0065948 A1 | 3/2010 | Bae et al. |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0308435 A1* | 12/2010 | Nowak et al. ................. 257/532 |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0095435 A1 | 4/2011 | Volant et al. |
| 2011/0139497 A1 | 6/2011 | Li et al. |
| 2011/0298130 A1* | 12/2011 | Kang ........................... 257/738 |
| 2011/0316168 A1* | 12/2011 | Moon et al. ................... 257/774 |
| 2012/0080772 A1* | 4/2012 | Asami et al. .................. 257/532 |
| 2012/0261826 A1* | 10/2012 | Kuo et al. ..................... 257/774 |
| 2013/0015504 A1* | 1/2013 | Kuo et al. ..................... 257/213 |

* cited by examiner

SEMICONDUCTOR DEVICE HAVING SHIELDED CONDUCTIVE VIAS

BACKGROUND OF THE INVENTION

1. Field of the Invention

The present invention relates to the field of semiconductor packaging, and more particularly, to 3-D semiconductor packaging.

2. Description of the Related Art

The conventional method for forming through silicon vias is described as follows. First, a plurality of grooves are formed on a first surface of a silicon substrate. An insulation layer is then formed on the side walls of the grooves by chemical vapor deposition, forming a plurality of accommodating rooms. The material used for the insulation layer is usually silicon dioxide. Then, the accommodating rooms are filled with a conductive metal, usually copper. Finally, the first surface and a second surface of the substrate are ground or etched so as to expose the conductive metal, thus a plurality of conductive vias are formed.

A notable disadvantage of the conventional approach is described as follows. When signals are transmitted, the energy loss of the signals will be relatively high while the signals pass through the conductive vias, so that the quality of transmission is poor.

SUMMARY OF THE INVENTION

One aspect of the disclosure relates to a semiconductor device. In one embodiment, the semiconductor device includes a substrate having a conductive via, the conductive via including an inner conductive layer surrounding a central axis of a through hole in the substrate and a shielding layer surrounding the inner conductive layer. An insulation material is disposed between the inner conductive layer and the shielding layer. In the illustrated embodiment, the inner conductive layer and the shielding layer are ring structures substantially coaxial to the central axis and the shielding layer is disposed on an outer side wall of the through hole. The inner conductive layer surrounds a central portion which can be part of the substrate itself or a different material (e.g., metal) disposed therein. Additionally, on a first surface of the substrate, a first metal layer is disposed contacting the shielding layer.

In an embodiment, the substrate includes a central groove, an outer groove, and an isolation material, wherein the central groove is defined by the inner conductive layer, the outer groove surrounds the shielding layer, and the isolation material is disposed in the central groove and the outer groove.

The semiconductor device further includes a first passivation layer disposed on the first metal layer having a first opening to expose the inner conductive layer; and a first redistribution layer disposed in the first opening of the first passivation layer so as to contact the inner conductive layer. A first protection layer is disposed on the first redistribution layer and the first passivation layer, having a first opening to expose a part of the first redistribution layer; a first under bump metallurgy is disposed in the first opening of the first protection layer; and a first bump is disposed on the first under bump metallurgy.

In an embodiment, the semiconductor device further includes a second metal layer disposed on a second surface of the substrate and contacting the shielding layer; a second passivation layer disposed on the second metal layer and having a second opening to expose the inner conductive layer; a second redistribution layer disposed in the second opening of the second passivation layer so as to contact the inner conductive layer; a second protection layer disposed on the second redistribution layer and the second passivation layer, and having a second opening to expose a part of the second redistribution layer; a second under bump metallurgy disposed in the second opening of the second protection layer; and a second bump disposed on the second under bump metallurgy.

Another aspect of the disclosure relates to a semiconductor device that includes a substrate; a first conductive via including a shielding layer, a first inner conductive layer, and an insulation material, the shielding layer surrounding the first conductive layer, the first inner conductive layer surrounding a central axis of a first through hole in the substrate, and the insulation material disposed between the shielding layer and the first inner conductive layer; a second conductive via including a second inner conductive layer, the second inner conductive via disposed on a sidewall of a second through hole in the substrate; and a metal layer disposed on a surface of the substrate, the metal layer covering the second conductive via and contacting the shielding layer of the first conductive via and the second inner conductive layer of the second conductive via.

The semiconductor device further comprises a passivation layer, disposed on the metal layer and having a first opening to expose the first inner conductive layer and a second opening to expose part of the metal layer; and a redistribution layer including a first redistribution portion and a second redistribution portion, the first redistribution portion, disposed in the first opening of the passivation layer so as to contact the first inner conductive layer and the second redistribution portion disposed in the second opening of the passivation layer so as to contact the metal layer.

Another aspect of the disclosure relates to manufacturing methods. In one embodiment, a manufacturing method includes providing a substrate, the substrate having a first surface and a second surface; forming a ring groove on the first surface of the substrate, wherein the ring groove surrounds a central portion and has an inner side wall, an outer side wall and a bottom surface; forming an interconnection metal layer on the inner side wall and the outer side wall to form an inner metal layer and a shielding layer, respectively; forming an insulation material on the interconnection metal layer; forming a first metal layer on the first surface of the substrate, wherein the first metal layer contacts the shielding layer; and thinning the substrate from the second surface of the substrate to remove a part of the substrate so as to expose the inner metal layer and the shielding layer.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
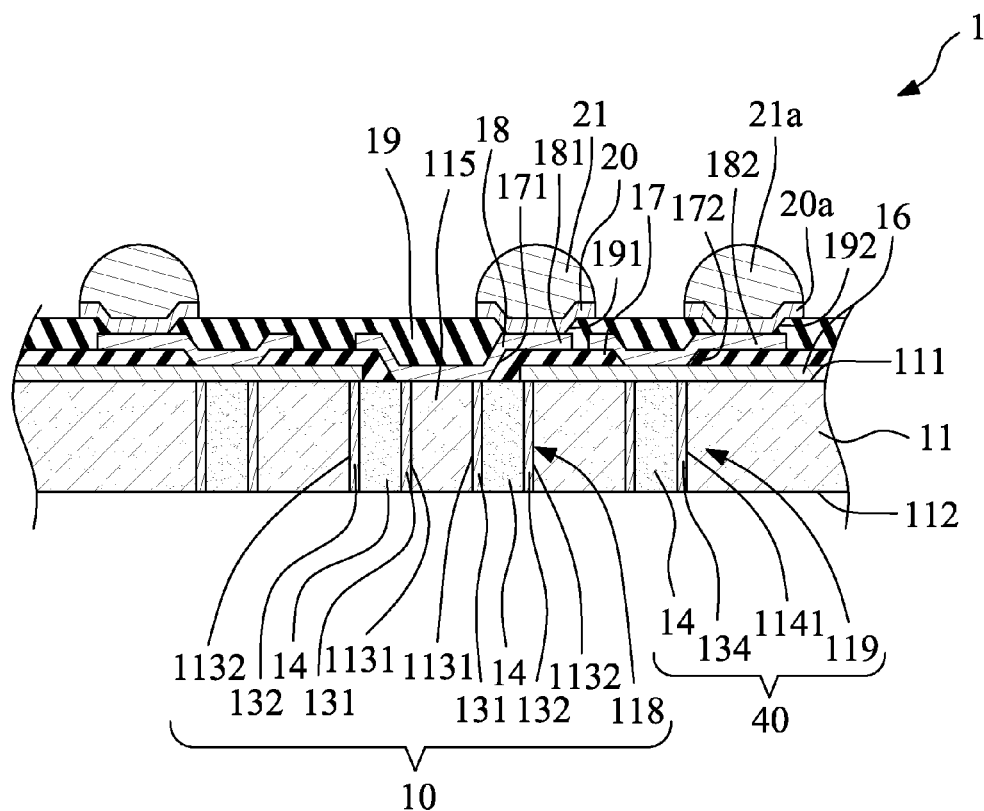
FIG. 1 illustrates a cross-sectional view of a semiconductor device having a shielding layer according to an embodiment of the present invention.

Referring to FIG. 1, a cross-sectional view of a semiconductor device 1 according to an embodiment of the present invention is illustrated. The semiconductor device 1 comprises a substrate 11, a first conductive via 10, a second conductive via 40, a first metal layer 16, a first passivation layer 17, a first redistribution layer 18, a first protection layer 19, a first under bump metallurgy (UBM) 20, a first bump 21, a second UBM 20a, and a second bump 21a.

In this embodiment, the substrate 11 is a silicon substrate or a wafer, which has a first surface 111 and a second surface 112. The first conductive via 10 includes a first through hole 118, an inner metal layer 131, a shielding layer 132 and an insulation material 14. The first through hole 118 penetrates through the substrate 11. An inner metal layer 131 is disposed in the first through hole 118 and exposed to the first surface 111 and a second surface 112 of the substrate 11. The inner metal layer 131 is a ring structure and surrounds a central axis of the first through hole 118.

The shielding layer 132 is disposed in the first through hole 118 and exposed to the first surface 111 and the second surface 112 of the substrate 11. The shielding layer 132 is a ring structure surrounding the inner metal layer 131 and substantially coaxial thereto. It is to be understood that in addition to being ring structures, the inner metal layer 131 and the shielding layer 132 may also have annular or cylindrical characteristics.

The shielding layer 132 is a shielding structure, which can be used to adjust the impedance of the signals and optimize the electrical properties. When signals are transmitted, the energy loss of the signals will be relatively low while the signals pass through the first conductive via 10, so that the quality of transmission is significantly raised.

In this embodiment, the first through hole 118 is a ring structure. That is, the substrate 11 further has a central portion 115. The central portion 115 is a part of the substrate 11 within the center first through hole 118. The first through hole 118 surrounds the central portion 115, and has an inner side wall 1131 and an outer side wall 1132. The inner side wall 1131 is an outer peripheral surface of the central portion 115. The inner metal layer 131 is disposed on the inner side wall 1131, and the shielding layer 132 is disposed on the outer side wall 1132.

The insulation material 14 is disposed between the inner metal layer 131 and the shielding layer 132. In this embodiment, the insulation material 14 is a polymer. Thus, the resultant structure includes the inner metal layer 131 disposed on the inner side wall 1131, the shielding layer disposed on outer side wall 1132, and the polymer insulation material 14 disposed between the inner metal layer 131 and the shielding layer 132. However, it is to be understood that the insulation material 14 could be air. In that case, the resultant structure would include the inner metal layer 131 disposed on the inner side wall 1131, the shielding layer disposed on outer side wall 1132, and the area between the inner metal layer 131 and the shielding layer 132 would be filled only with air.

The second conductive via 40 includes a second through hole 119, a side wall metal 134 and the insulation material 14. A second through hole 119 penetrates through the substrate 11 and has a side wall 1141. The side wall metal 134 is disposed on the side wall 1141 and exposed to the first surface 111 and the second surface 112 of the substrate 11. The side wall metal 134 defines an accommodating room in which the insulation material 14 is disposed.

As illustrated in FIG. 1, the first metal layer 16 is disposed on the first surface 111 of the substrate 11. The first metal layer 16 contacts the shielding layer 132 of the first conductive via 10 but does not contact the inner metal layer 131 of the first conductive via 10. In this embodiment, the first metal layer 16 further covers the second conductive via 40 and contacts the side wall metal 134. The first metal layer 16 is a ground plane or power plane, which contacts the shielding layer 132 directly. Accordingly, high quality of signals is maintained and the layout is more flexible compared with conventional designs. In the present invention, because the ground plane (the first metal layer 16) is disposed within the substrate 11, all of the traces which need to be grounded can be connected to the ground plane. Advantageously, only one external pad is needed to interconnect the ground plane (the first metal layer 16) and the ground layer of an organic substrate.

As shown in FIG. 1, the first passivation layer 17 is disposed on the first metal layer 16 and has a first opening 171 and a second opening 172. The first opening 171 corresponds to the first conductive via 10 and exposes the inner metal layer 131. A second opening 172 corresponds to the second conductive via 40 and exposes a part of the first metal layer 16. The material of the first passivation layer 17 can be polyimide (PI) or polypropylene (PP).

The first redistribution layer 18 includes a first portion 181 and a second portion 182. The first portion 181 is disposed in the first opening 171 of the first passivation layer 17 so as to contact the inner metal layer 131. The second portion 182 is disposed in the second opening 172 of the first passivation layer 17 so as to contact the first metal layer 16. The first portion 181 is not electrically connected to the second portion 182. The first portion 181 and the second portion 182 of the first redistribution layer 18 further extend to the top surface of the first passivation layer 17.

As shown in FIG. 1, the first protection layer 19 is disposed on the first redistribution layer 18 and the first passivation layer 17, and has a first opening 191 and a second opening 192. The first opening 191 exposes the first portion 181 of the first redistribution layer 18, and a second opening 192 exposes the second portion 182 of the first redistribution layer 18. The materials of the first protection layer 19 and the first passivation layer 17 may be the same or different. The first UBM 20 is disposed in the first opening 191 of the first protection layer 19, and the second UBM 20a is disposed in the second opening 192 of the first protection layer 19. The first bump 21 is disposed on the first UBM 20, and the second bump 21a is disposed on the second UBM 20. The first bump 21 is used for transmitting signals, and the second bump 21a is electrically connected to ground or power.

Referring to FIG. 2 to FIG. 14, a method for making the semiconductor device according to an embodiment of the present invention is illustrated.

Figure 2:
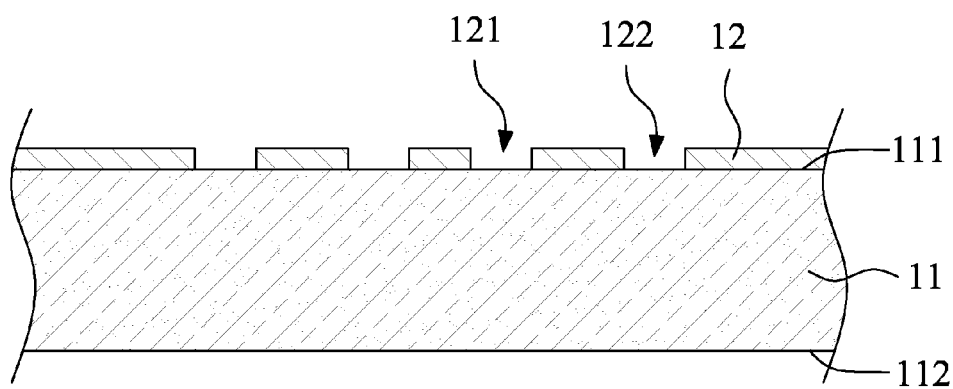
FIG. 2 to FIG. 14 illustrate a method for making a semiconductor device having the shielding layer according to an embodiment of the present invention.

Referring to FIG. 2, a substrate 11 is provided. The substrate 11 has the first surface 111 and the second surface 112. The substrate 11 may be a silicon substrate or a wafer. Then, a first photoresist layer 12 is formed on the first surface 111 of the substrate 11. A first photoresist layer opening 121 and a second photoresist layer opening 122 are formed on the first photoresist layer 12, wherein the first photoresist layer opening 121 is an annular opening.

Figure 3A:
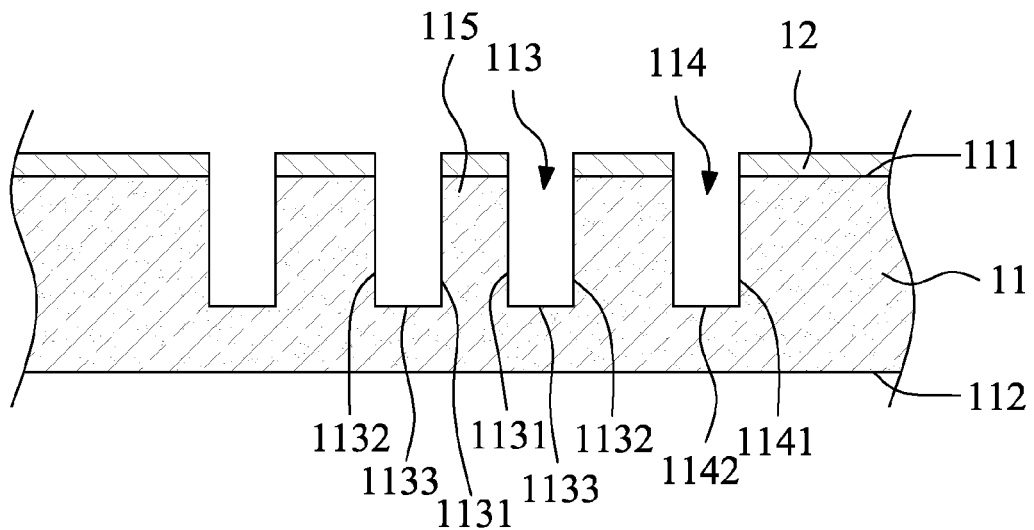

Referring to FIG. 3A, a first opening 113 and at least one second opening 114 are then formed on the first surface 111 of the substrate 11 according to the first photoresist layer opening 121 and the second photoresist layer opening 122 by etching, respectively. The first opening 113 is annular, surrounding the central portion 115 (the central portion 115 is a part of the substrate 11) and has an inner side wall 1131, the outer side wall 1132 and a bottom surface 1133. The inner side wall 1131 is an outer peripheral surface of the central portion 115. The second opening 114 is hollow and has the side wall 1141 and a bottom surface 1142.

Figure 3B:
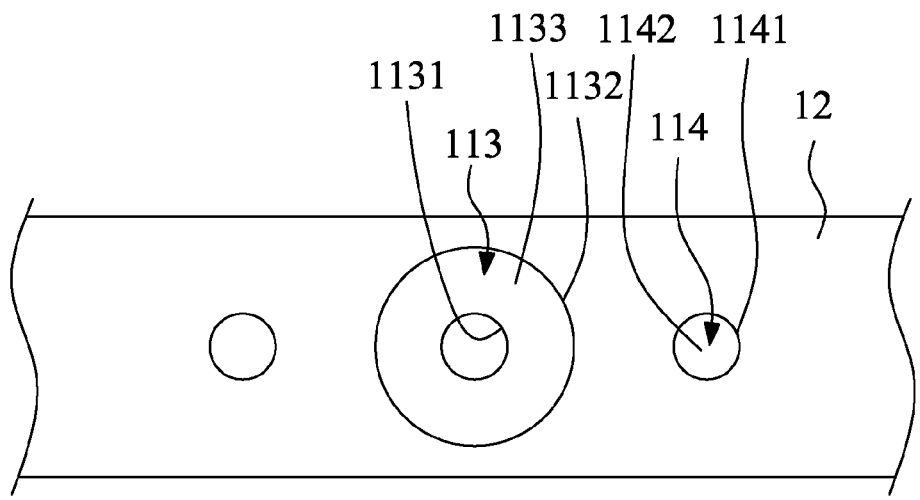

Referring to FIG. 3B, a top view of FIG. 3A is illustrated. The first opening 113 has the inner side wall 1131, the outer side wall 1132 and the bottom surface 1133, wherein the inner side wall 1131 and the outer side wall 1132 are substantially circular. The second opening 114 is hollow and has the side wall 1141 and the bottom surface 1142, wherein the side wall 1141 is substantially circular.

Figure 4A:
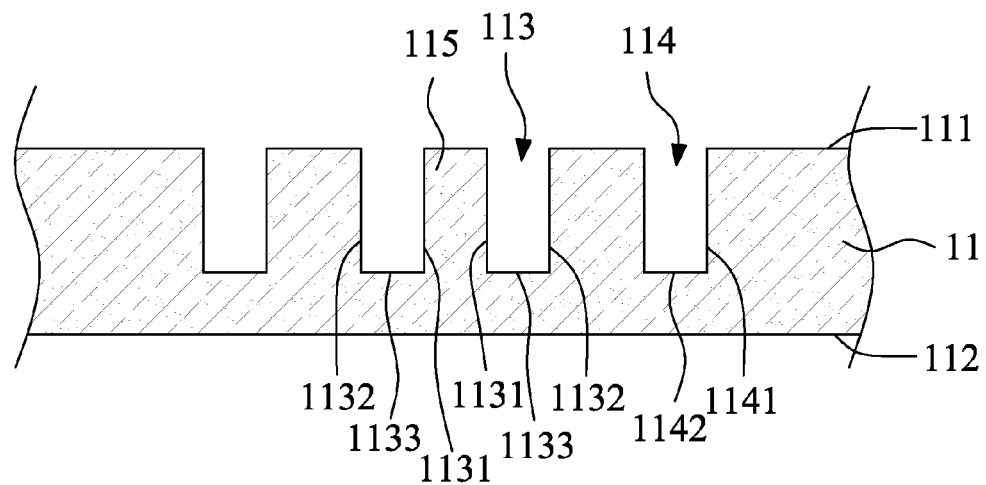

Referring to FIG. 4A, the first photoresist layer 12 is removed.

Figure 4B:
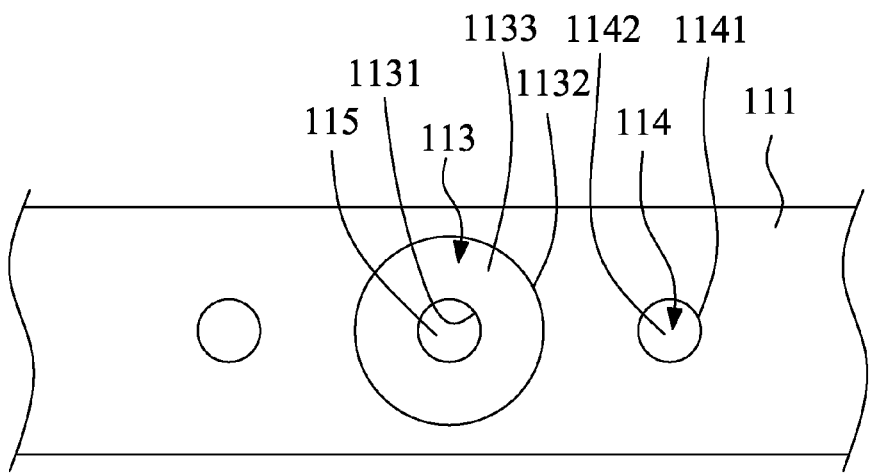

Referring to FIG. 4B, a top view of FIG. 4A is illustrated. The first surface 111 of the substrate 11 is exposed. The first opening 113 surrounds the central portion 115, and the inner side wall 1131 is an outer peripheral surface of the central portion 115.

Figure 5A:
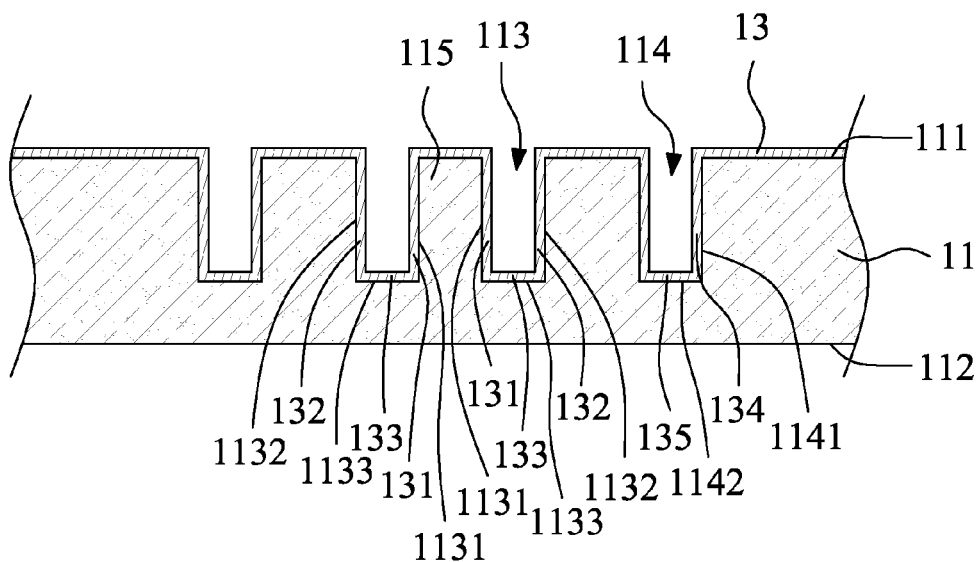

Referring to FIG. 5A, an interconnection metal layer 13 is formed on the first surface 111 of the substrate 11, the first opening 113 and the second opening 114 by electroplating. Meanwhile, in the first opening 113, the interconnection metal layer 13 is formed on the inner side wall 1131, the outer side wall 1132 and a bottom surface 1133 to form an inner metal layer 131, the shielding layer 132 and a bottom metal 133, respectively; in the second opening 114, the interconnection metal layer 13 is formed on the side wall 1141 and a bottom surface 1142 to form the side wall metal 134 and a bottom metal 135, respectively. In this embodiment, the material of the interconnection metal layer 13 is copper.

Figure 5B:
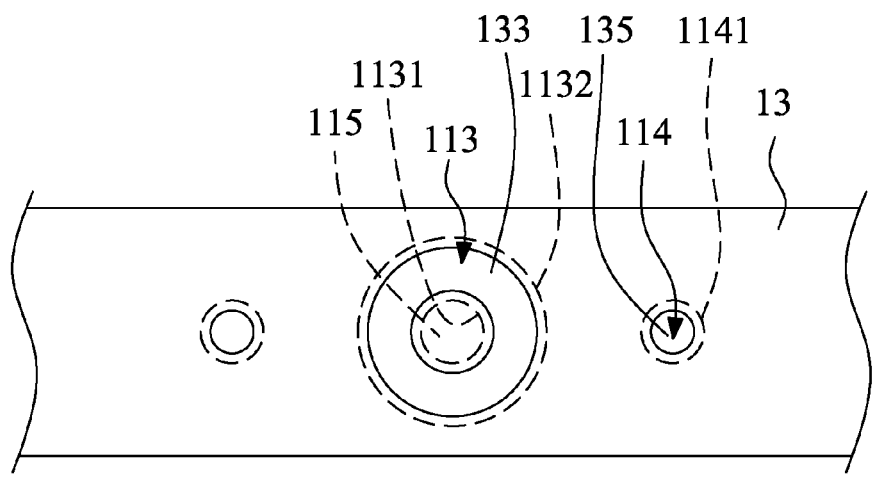

Referring to FIG. 5B, a top view of FIG. 5A is illustrated. The interconnection metal layer 13 covers the first surface 111 of the substrate 11, and is further disposed in the first opening 113 and the second opening 114. The interconnection metal layer 13 does not fill up the first opening 113 and the second opening 114. Because the inner side wall 1131, the outer side wall 1132 and the central portion 115 are covered by the interconnection metal layer 13, they are shown by dash lines.

Figure 6A:
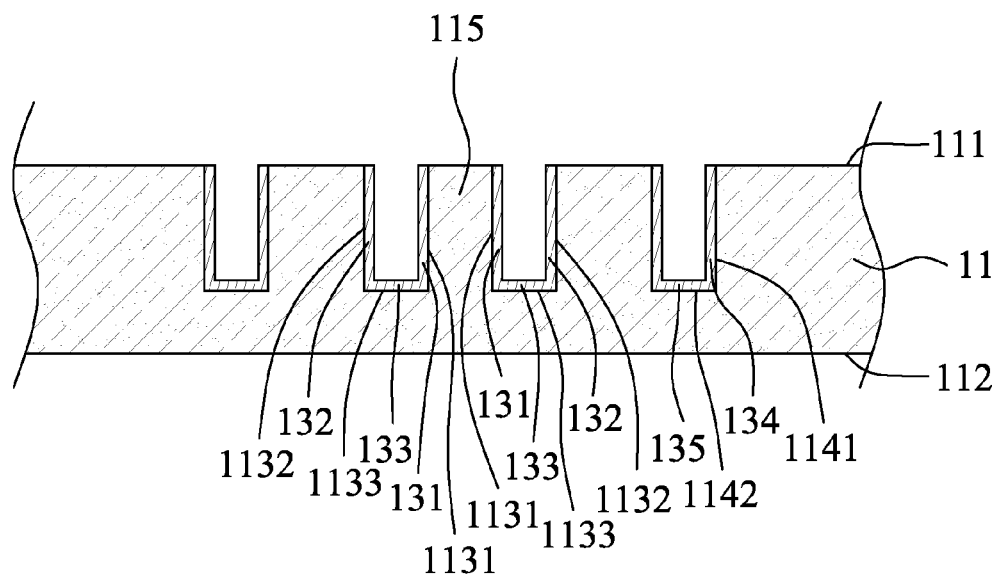

Referring to FIG. 6A, the interconnection metal layer 13 that is disposed on the first surface 111 of the substrate 11 is removed, and the inner metal layer 131, the shielding layer 132, the bottom metal 133, the side wall metal 134 and a bottom metal 135 remain.

Figure 6B:
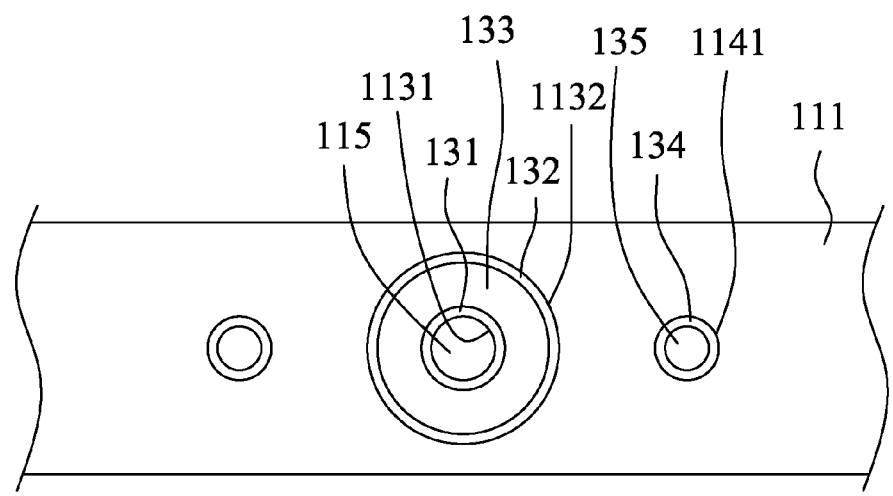

Referring to FIG. 6B, a top view of FIG. 6A is illustrated. The first surface 111 of the substrate 11 is exposed, and the inner metal layer 131, the shielding layer 132 and the side wall metal 134 are ring-shaped.

Figure 7A:
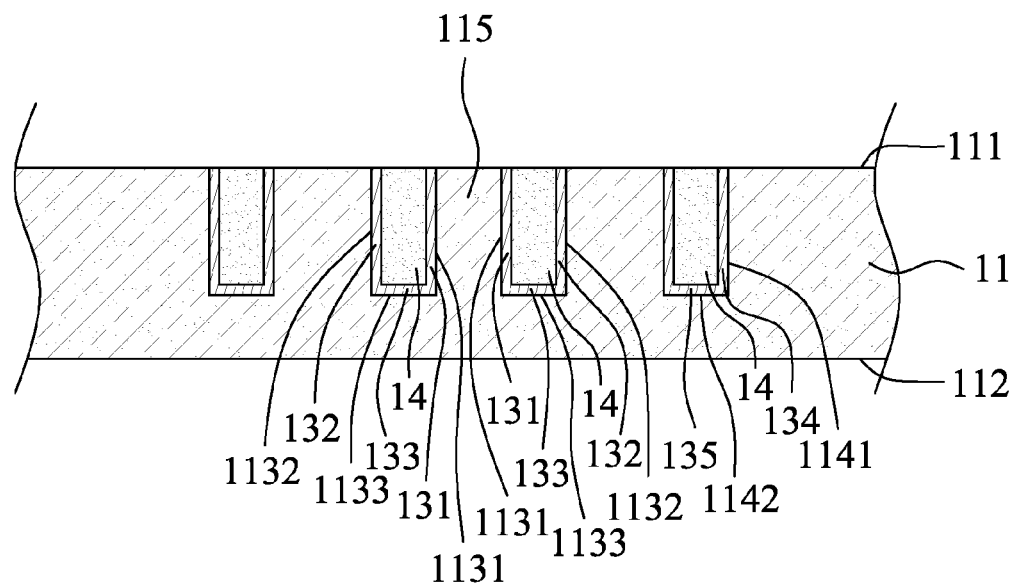

Referring to FIG. 7A, an insulation material 14 is formed on the interconnection metal layer 13 (see FIG. 5A) and fill up the first opening 113 and the second opening 114. In this embodiment, the material of the insulation material 14 is a polymer.

Figure 7B:
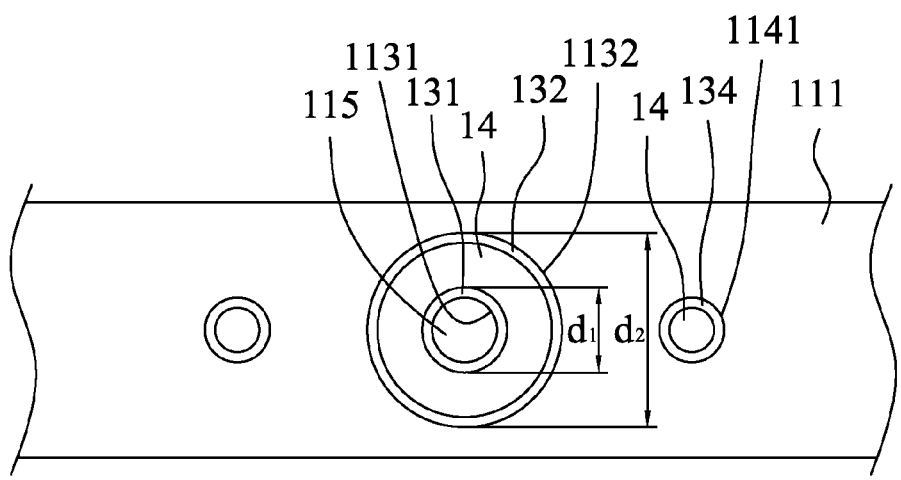

Referring to FIG. 7B, a top view of FIG. 7A is illustrated. The maximum outside diameter of the inner metal layer 131 is d1, and the maximum outside diameter of the shielding layer 132 is d2. The ratio of d2/d1 chosen will depend on characteristic impedance design requirements and dielectric material properties.

Figure 8:
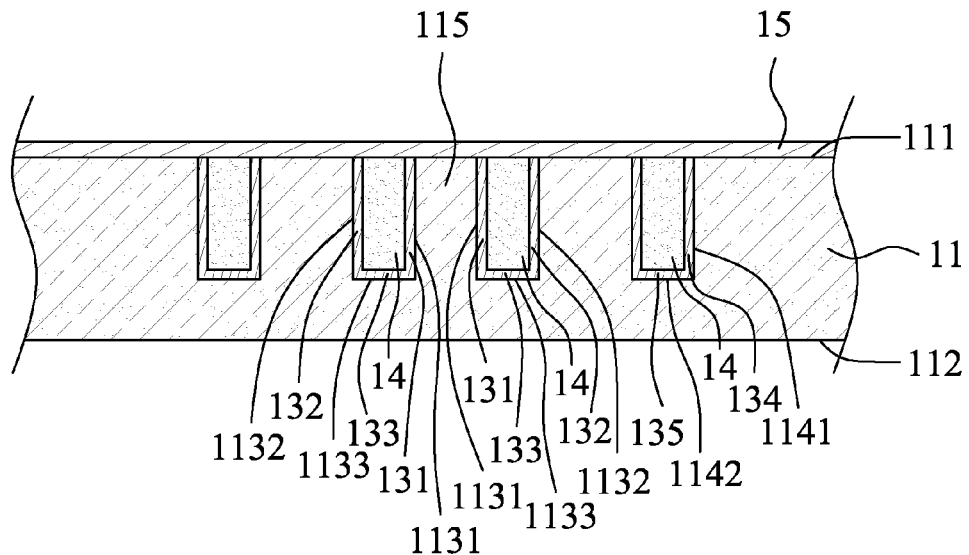

Referring to FIG. 8, a second photoresist layer 15 is formed on the first surface 111 of the substrate 11.

Figure 9:
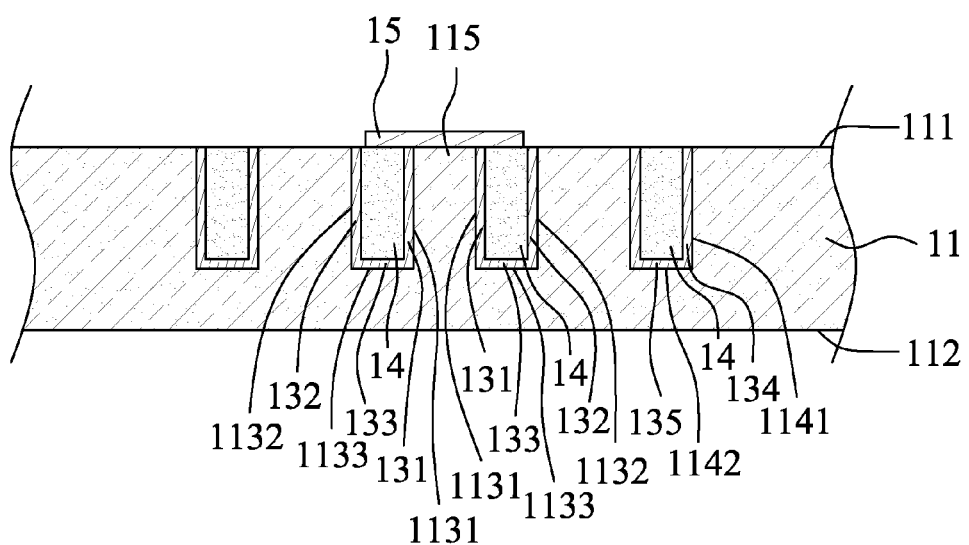

Referring to FIG. 9, a part of the second photoresist layer 15 is removed, so that a remaining second photoresist layer 15 covers the inner metal layer 132 and a part of the insulation material 14.

Figure 10:
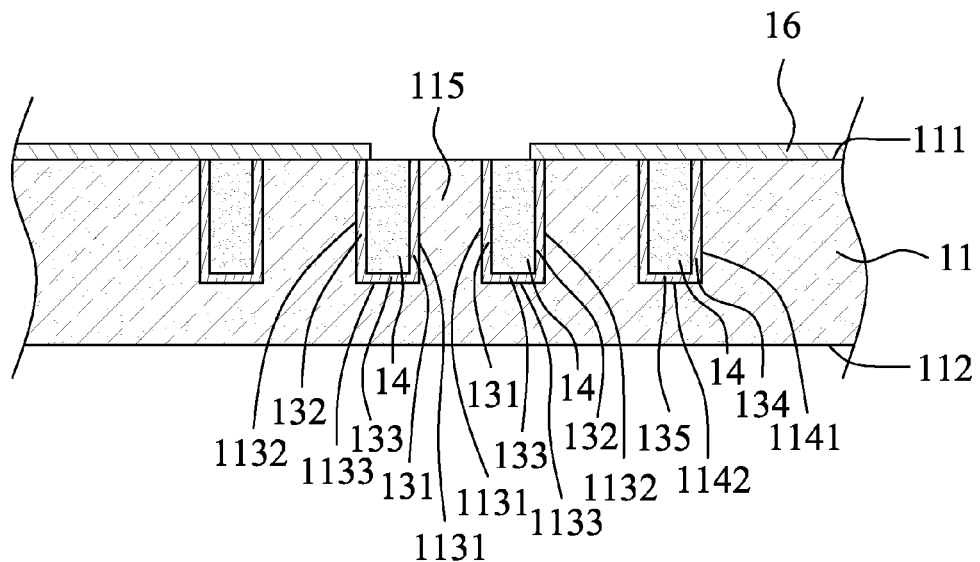

Referring to FIG. 10, the first metal layer 16 is formed on the first surface 111 of the substrate 11. The first metal layer 16 contacts the shielding layer 132 and the side wall metal 134. Then, the second photoresist layer 15 is removed completely, so that the inner metal layer 132 and a part of the insulation material 14 is exposed.

Figure 11:
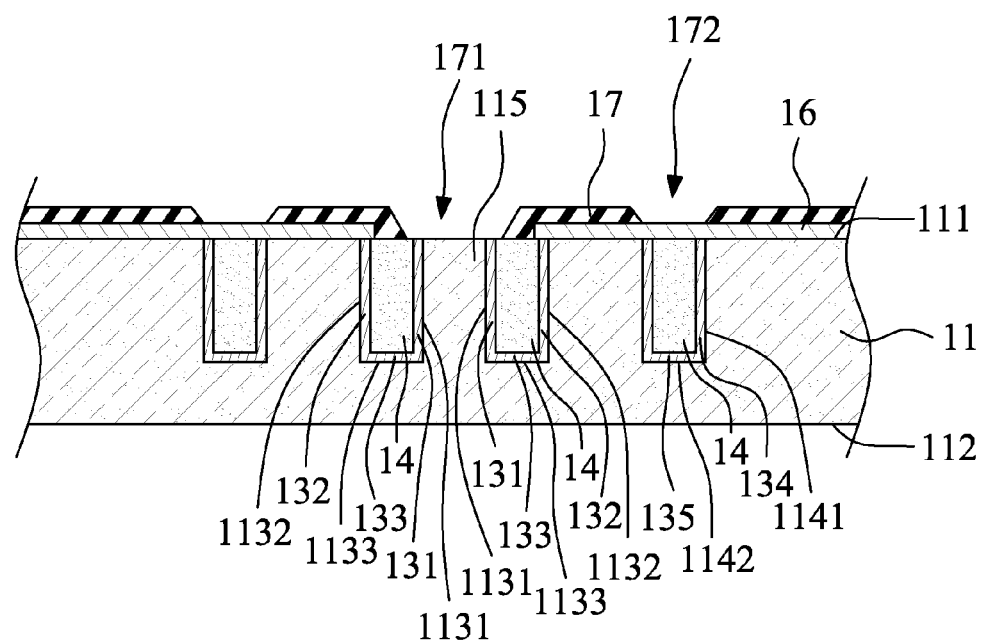

Referring to FIG. 11, the first passivation layer 17 is formed on the first metal layer 16, and includes the first opening 171 and the second opening 172. The first opening 171 exposes the inner metal layer 131; and the second opening 172 exposes a part of the first metal layer 16.

Figure 12:
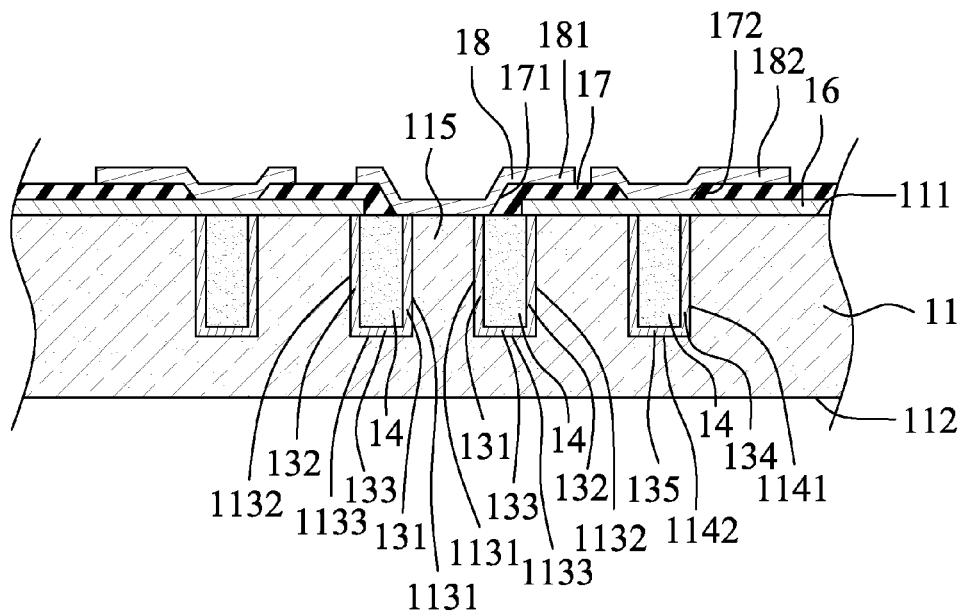

Referring to FIG. 12, the first redistribution layer 18 is formed on the first passivation layer 17. The first redistribution layer 18 has the first portion 181 and the second portion 182. The first portion 181 is disposed in the first opening 171 of the first passivation layer 17 to contact the inner metal layer 131. The second portion 182 is disposed in the second opening 172 of the first passivation layer 17 to contact the first metal layer 16. The first portion 181 is not electrically connected to the second portion 182. The first portion 181 and the second portion 182 of the first redistribution layer 18 further extend to the top surface of the first passivation layer 17.

Figure 13:
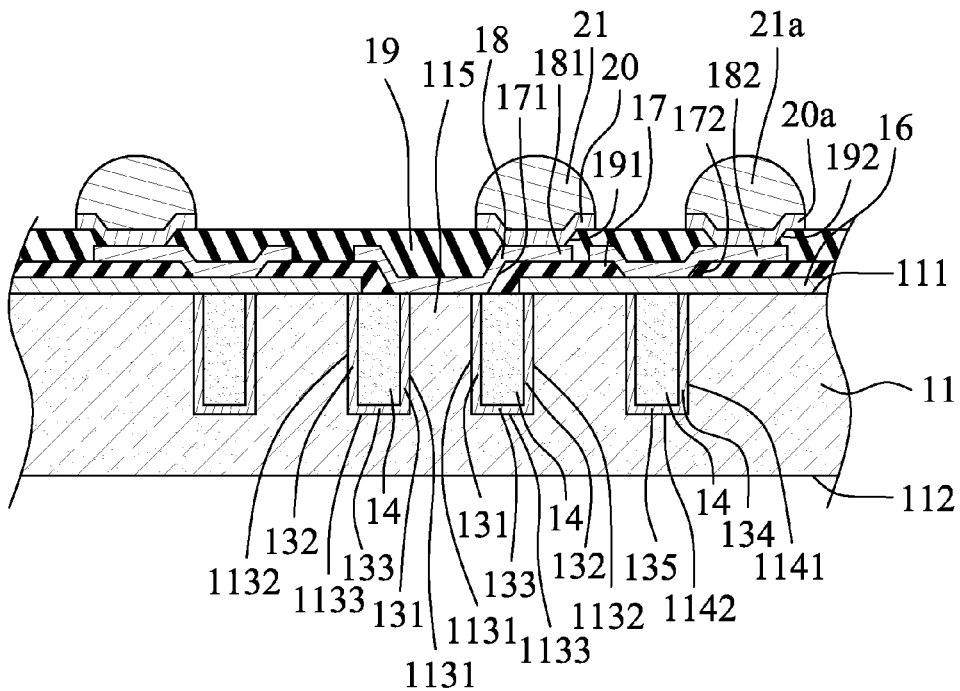

Referring to FIG. 13, the first protection layer 19 is formed on the first redistribution layer 18 and the first passivation layer 17. Then, the first opening 191 and the second opening 192 are formed on the first protection layer 19. The first opening 191 exposes the first portion 181 of the first redistribution layer 18, and the second opening 192 exposes the second portion 182 of the first redistribution layer 18. The materials of the first protection layer 19 and the first passivation layer 17 may be the same or different.

As shown in FIG. 13, the first UBM 20 is formed in the first opening 191 of the first protection layer 19; and the second UBM 20a is formed in the second opening 192 of the first protection layer 19. Then, the first bump 21 is formed on the first UBM 20; and the second bump 21a is formed on the second UBM 20a.

Figure 14:
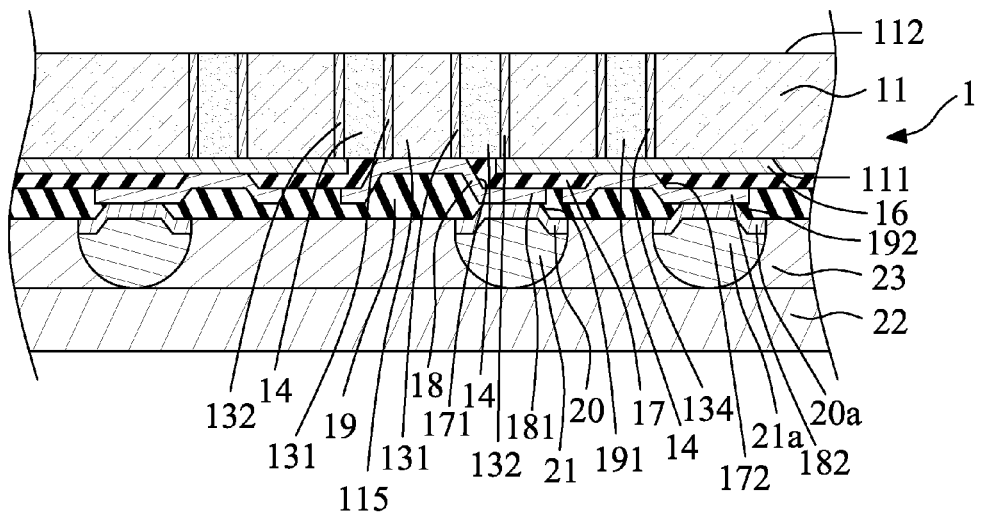

Referring to FIG. 14, a carrier 22 is provided. Then, the substrate 11 is adhered to the carrier 22 by an adhesive layer 23, wherein the first surface 111 of the substrate 11 faces the carrier 22. Then, the substrate 11 is thinned from the second surface 112 thereof by grinding or etching. The bottom metals 133, 135 and a part of the substrate 11 are removed so that the inner metal layer 131, the shielding layer 132, the insulation material 14 and the side wall metal 134 are exposed. The inner metal layer 131 is not electrically connected to the shielding layer 132.

Then, the carrier 22 is detached, and the substrate 11 is turned upside down for 180 degrees as so to obtain the semiconductor device 1 of FIG. 1.

Figure 15:
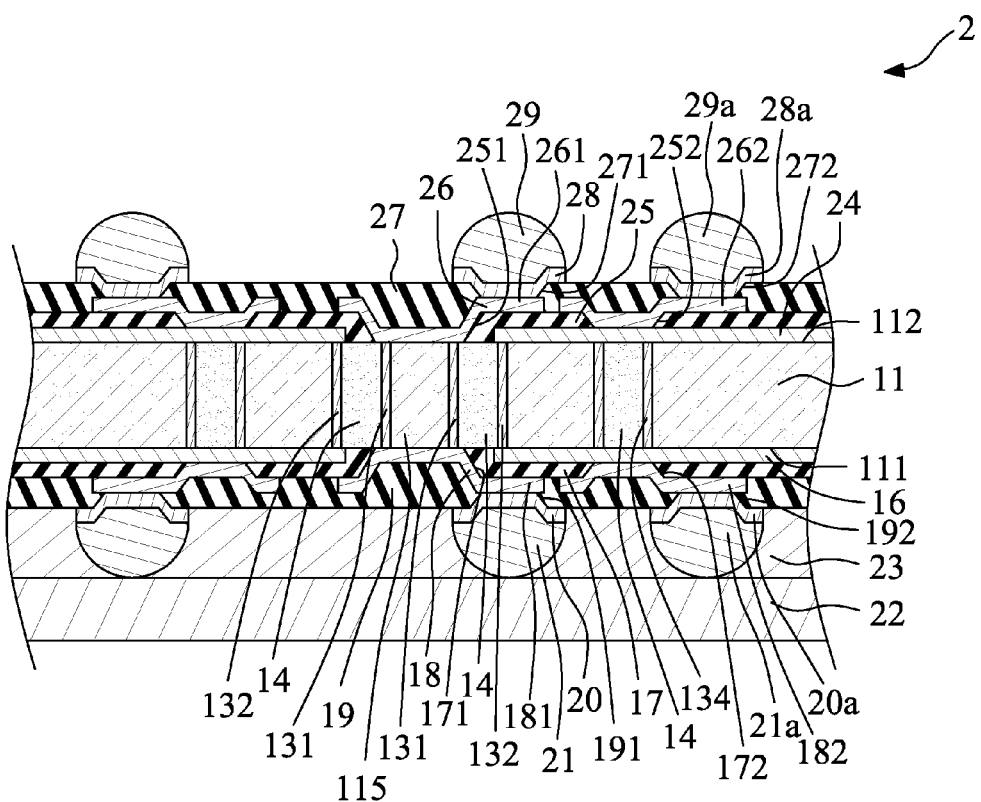
FIG. 15 to FIG. 16 illustrate a method for making a semiconductor device having a shielding layer according to another embodiment of the present invention.
Figure 16:
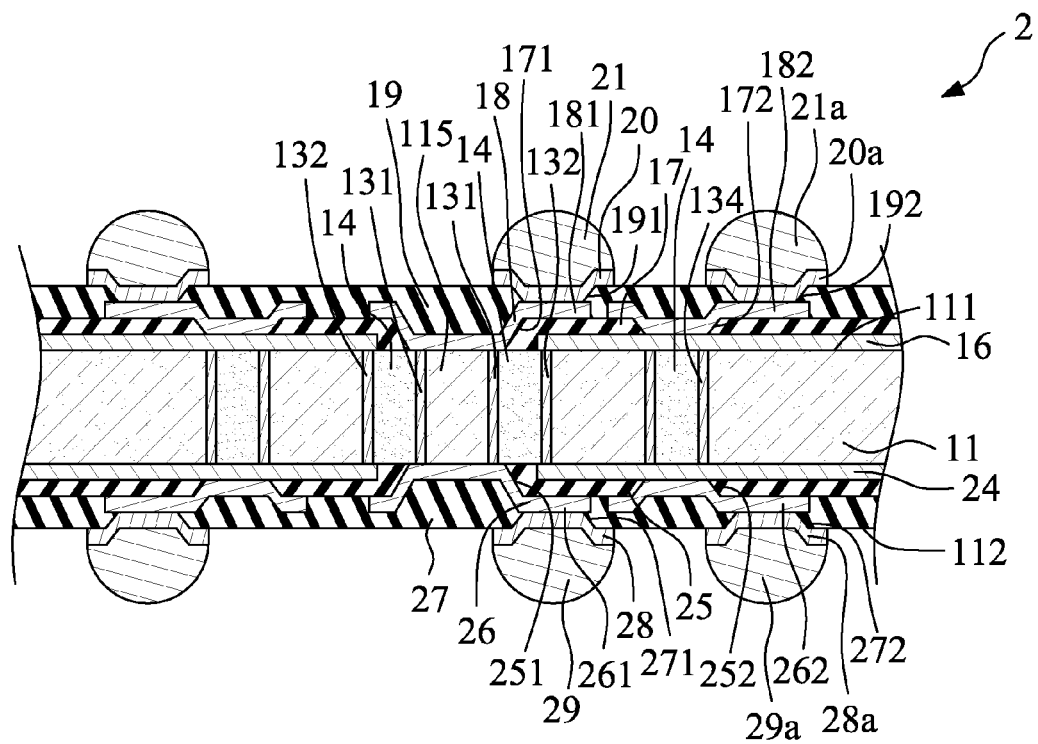

Referring to FIG. 15 to FIG. 16, a method for making a semiconductor device according to another embodiment of the present invention is illustrated.

In this embodiment, the "front end" processing is the same as in the method described in FIG. 2 to FIG. 14. The method of this embodiment continues from the step of FIG. 14, and a structure similar to the structure in the first surface 111 of the substrate 11 is formed on the second surface 112 of the substrate 11.

As shown in FIG. 15, a second metal layer 24 is formed on the second surface 112 of the substrate 11. The second metal layer 24 contacts the shielding layer 132 but does not contact the inner metal layer 131. Then, a second passivation layer 25 is formed on the second metal layer 24, and has a first opening 251 and a second opening 252. The first opening 251 exposes the inner metal layer 131; and the second opening 252 exposes a part of the first metal layer 24. Then, a second redistribution layer 26 is formed on the second passivation layer 25. The second redistribution layer 26 has a first portion 261 and a second portion 262. The first portion 261 is disposed in the first opening 251 of the first passivation layer 25 to contact the inner metal layer 131. The second portion 262 is disposed in the second opening 252 of the first passivation layer 25 to contact the second metal layer 24. The first portion 261 is not electrically connected to the second portion 262.

As shown in FIG. 15, then, a second protection layer 27 is formed on the second redistribution layer 26 and the second passivation layer 25. A first opening 271 and a second opening 272 are formed on the second protection layer 27. The first opening 271 exposes the first portion 261 of the second redistribution layer 26, and the second opening 272 exposes the second portion 262 of the first redistribution layer 26. Then, a first UBM 28 is formed in the first opening 271 of the second protection layer 27; and a second UBM 28a is formed in the second opening 272 of the second protection layer 27. Then, a first bump 29 is formed on the first UBM 28; and a second bump 29a is formed on the second UBM 28a.

Referring to FIG. 16, the carrier 22 is detached, and the substrate 11 is turned upside down for 180 degrees as so to obtain the semiconductor device 2. The semiconductor device 2 is similar to the semiconductor device 1 of FIG. 1; the difference is that the semiconductor device 2 further comprises the second metal layer 24, the second passivation layer 25, the second redistribution layer 26, the second protection layer 24, the first UBM 28, the second UBM 28a, the first bump 29 and the second bump 29a.

As shown in FIG. 16, the second metal layer 24 is disposed on the second surface 112 of the substrate 11. The second metal layer 24 contacts the shielding layer 132 but does not contact the inner metal layer 131. In this embodiment, the second metal layer 24 further covers the side wall metal 134. The second metal layer 24 is a grounded plane or power plane. The second passivation layer 25 is disposed on the second metal layer 24 and has a first opening 251 and a second opening 252. The first opening 251 exposes the inner metal layer 131. The second opening 252 exposes a part of the second metal layer 24.

In FIG. 16, the second redistribution layer 26 includes a first portion 261 and a second portion 262. The first portion 261 is disposed in the first opening 251 of the second passivation layer 25 so as to contact the inner metal layer 131. The second portion 262 is disposed in the second opening 252 of the second passivation layer 25 so as to contact the second metal layer 24. The first portion 261 is not electrically connected to the second portion 262.

As illustrated in FIG. 16, the second protection layer 27 is disposed on the second redistribution layer 26 and the second passivation layer 25, and has a first opening 271 and a second opening 272. The first opening 271 exposes the first portion 261 of the second redistribution layer 26, and the second opening 272 exposes the second portion 262 of the second redistribution layer 26. The first UBM 28 is disposed in the first opening 271 of the second protection layer 27, and the second UBM 28a is disposed in the second opening 272 of the second protection layer 27. The first bump 29 is disposed on the first UBM 28, and the second bump 29a is disposed on the second UBM 28a.

Figure 17:
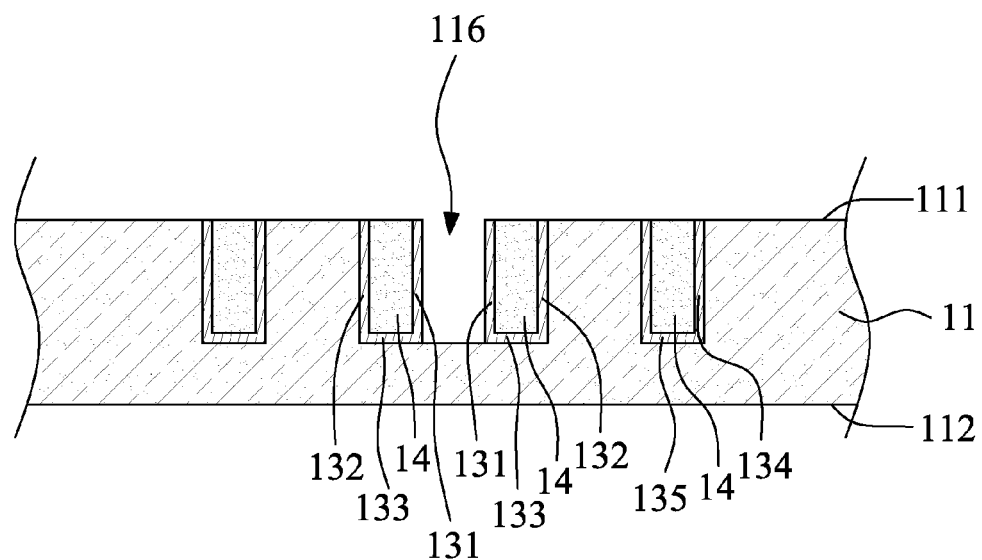
FIG. 17 to FIG. 19 illustrate a method for making a semiconductor device having the shielding layer according to another embodiment of the present invention.
Figure 18:
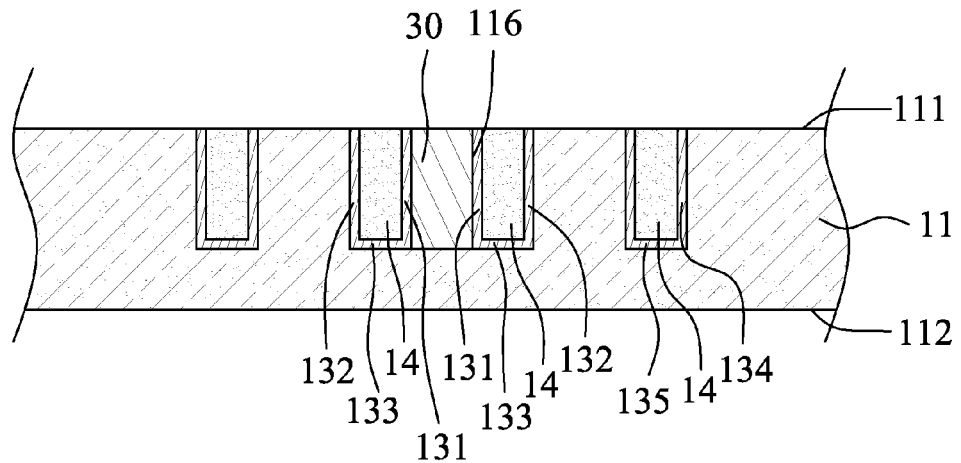
Figure 19:
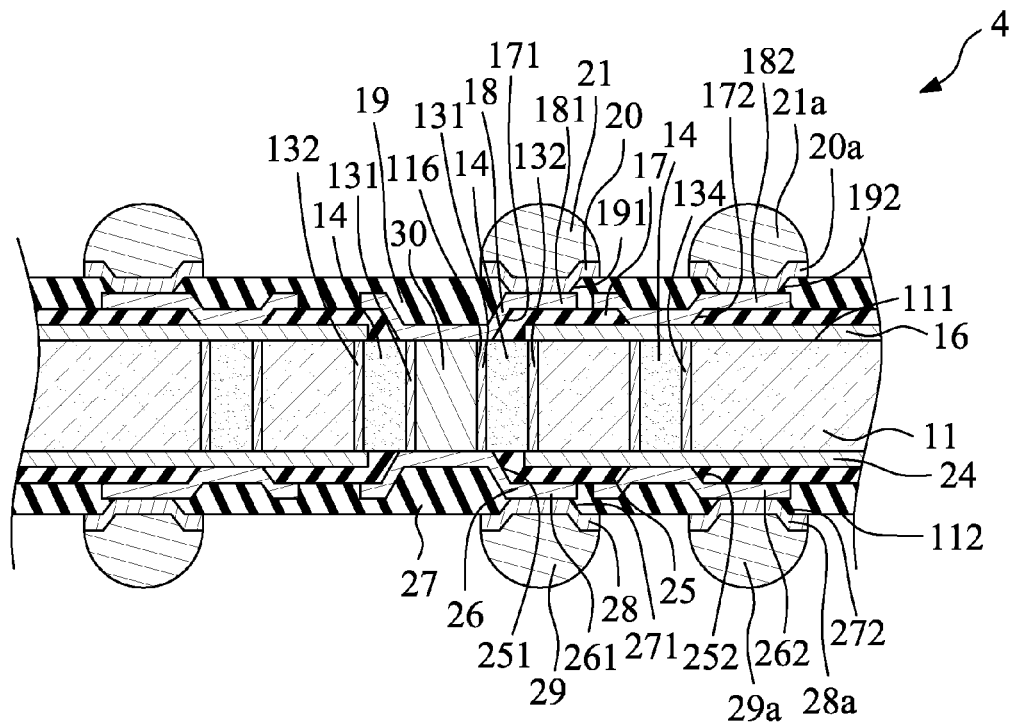

Referring to FIG. 17 to FIG. 19, a method for making a semiconductor device according to another embodiment of the present invention is illustrated. The method of this embodiment is similar to the method described in FIG. 15 to FIG. 16, and the difference is described as follows.

Referring to FIG. 17, the central portion 115 is removed (after the step shown in FIG. 11) so that a central groove 116 is formed.

Referring to FIG. 18, the central groove 116 is filled with a central material 30. It is to be understood that the central material 30 is an insulation material or a metal material.

Referring to FIG. 19, the subsequent process steps of the method of this embodiment is the same as the method described in FIG. 15 to FIG. 16, so as to obtain a semiconductor device 4 according to this embodiment. The semiconductor device 4 is similar to the semiconductor device 2 of FIG. 16. The difference is that in the semiconductor device 4, the substrate 11 further has the central groove 116 and central material 30. The central groove 116 is defined by the inner metal layer 131. The central material 30 fills the central groove 116, and the inner metal layer 131 is disposed on an outer peripheral surface of the central material 30. Preferably, the materials of the central material 30, the inner metal layer 131 and the shielding layer 132 are the same.

Figure 20:
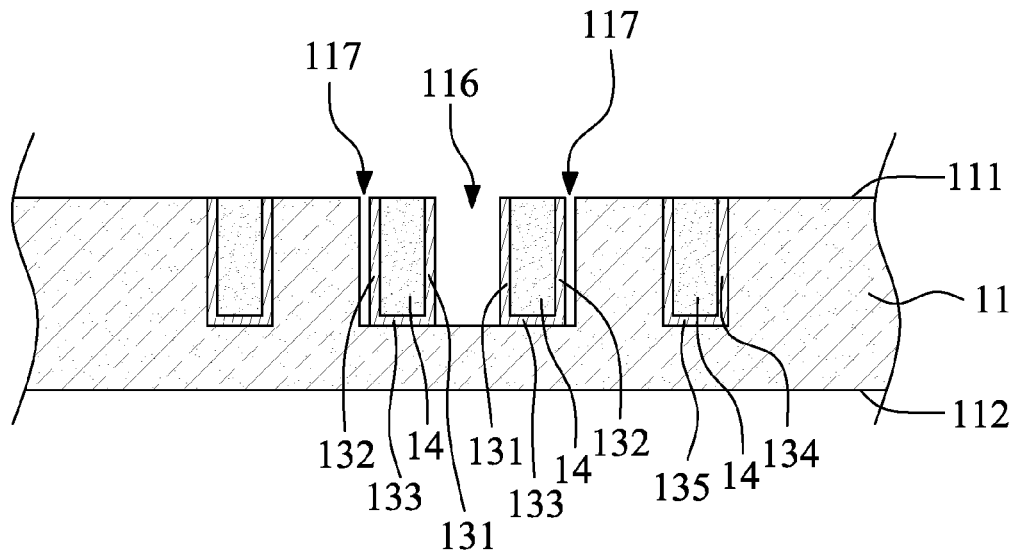
FIG. 20 to FIG. 22 illustrate a method for making a semiconductor device having the shielding layer according to another embodiment of the present invention.
Figure 21:
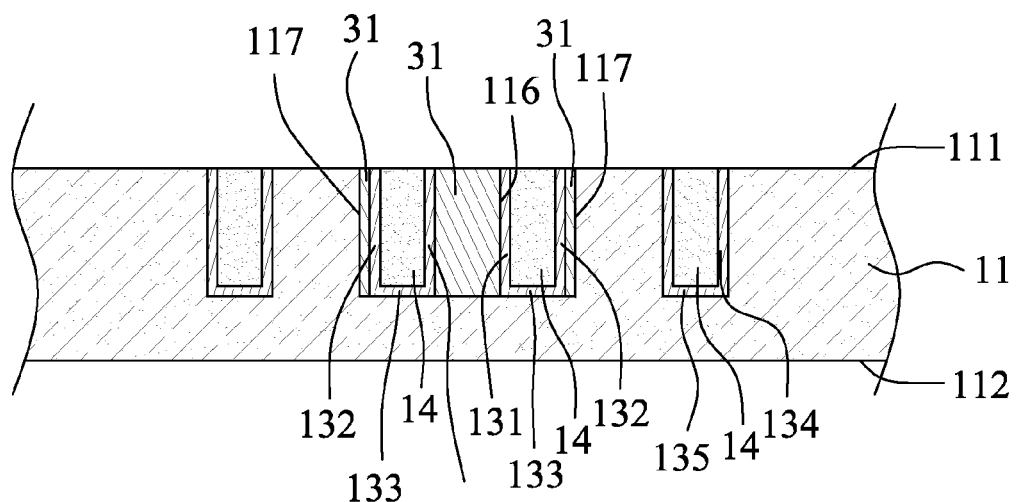
Figure 22:
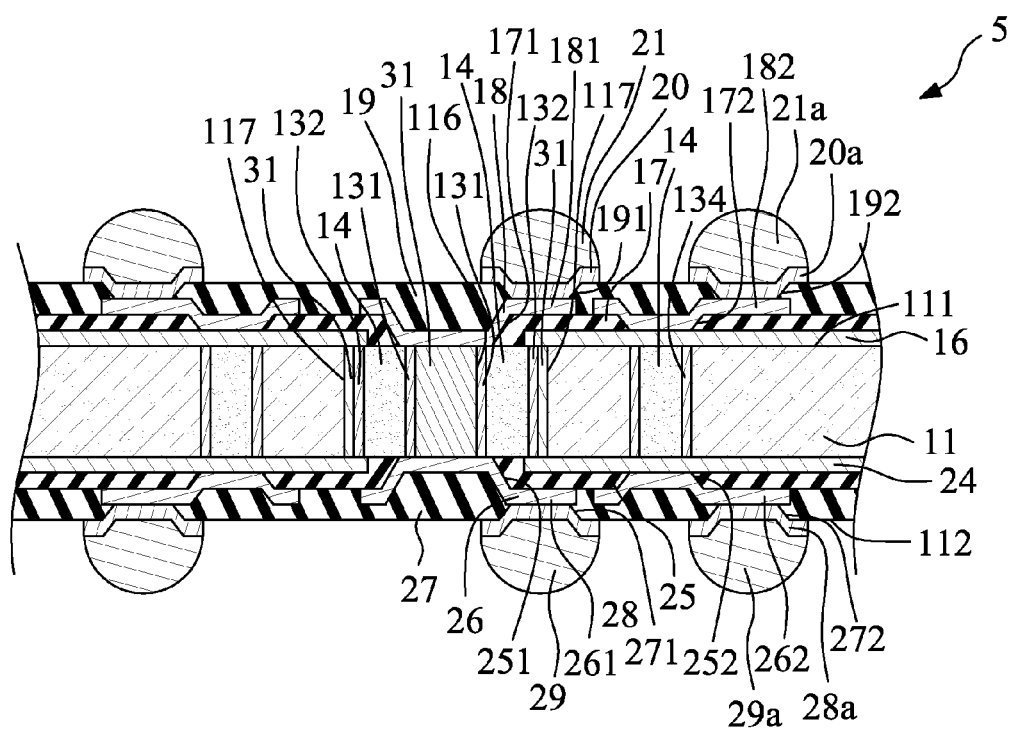

Referring to FIG. 20 to FIG. 22, a method for making a semiconductor device according to another embodiment of the present invention is illustrated. The method of this embodiment is similar to the method described in FIG. 15 to FIG. 16, and the difference is described as follows.

Referring to FIG. 20, the central portion 115 and the substrate surrounding the shielding layer 132 are removed after the step of FIG. 7A so that the central groove 116 and an outer groove 117 are formed. The outer groove 117 surrounds the shielding layer 132.

Referring to FIG. 21, an isolation material 31 is formed in the central groove 116 and the outer groove 117. Preferably, the materials of the isolation material 31 and the insulation material 14 are the same.

Referring to FIG. 22, the subsequent process of the method of this embodiment is the same as the method described in FIG. 15 to FIG. 16, so as to obtain a semiconductor device 5 according to this embodiment. The semiconductor device 5 is similar to the semiconductor device 2 of FIG. 16, and the difference is that in the semiconductor device 5, the substrate 11 further has a central groove 116, the outer groove 117 and the isolation material 31. The central groove 116 is defined by the inner metal layer 131, the outer groove 117 surrounding the shielding layer 132, and the isolation material 31 is disposed in the central groove 116 and the outer groove 117.

In an embodiment, the first metal layer 16 has a plurality of openings which forms a mesh appearance so as to increase the adhesive force between the first metal layer 16 and the first passivation layer 17. In embodiments in which the second metal layer is utilized, the second metal layer 24 can have the plurality of openings which forms the mesh appearance so as to increase the adhesive force between the second metal layer 24 and the first passivation layer 25. In either case, preferably, each of the openings is a square. However, it is understood that each of the openings may be circular or other geometric pattern.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device, comprising
a substrate composed of a semiconductor material;
a conductive via, the conductive via including
    an inner conductive layer surrounding a central axis of a through hole in the substrate;
    a metal shielding layer surrounding the inner conductive layer and disposed on a side wall of the through hole directly contacting the semiconductor material of the substrate; and
    an insulation material disposed between the inner conductive layer and the shielding layer;
    wherein the inner conductive layer and the shielding layer are ring structures substantially coaxial to the central axis; and
a first metal layer disposed on a first surface of the substrate, the first metal layer contacting the metal shielding layer.

2. The semiconductor device of claim 1, wherein the inner conductive layer surrounds a central portion.

3. The semiconductor device of claim 2, wherein the inner conductive layer is disposed on an outer peripheral surface of the central portion.

4. The semiconductor device of claim 2, wherein the central portion is made of a material different from the substrate.

5. The semiconductor device of claim 1, wherein the substrate further includes a central groove, an outer groove, and an isolation material, wherein the central groove is defined by the inner conductive layer, the outer groove surrounds the shielding layer, and the isolation material is disposed in the central groove and the outer groove.

6. The semiconductor device of claim 1, wherein the insulation material is one of polymer and air.

7. The semiconductor device of claim 1, wherein the metal layer is one of a ground plane and a power plane.

8. The semiconductor device of claim 1, further including:
a first passivation layer, disposed on the first metal layer and having a first opening to expose the inner conductive layer; and
a first redistribution layer, disposed in the first opening of the first passivation layer so as to contact the inner conductive layer.

9. The semiconductor device of claim 1, wherein the first metal layer has a plurality of openings which forms a mesh appearance.

10. A semiconductor device, comprising
a substrate;
a first conductive via including a shielding layer, a first inner conductive layer, and an insulation material, the shielding layer surrounding the first inner conductive layer, the first inner conductive layer surrounding a central axis of a first through hole in the substrate, and the insulation material disposed between the shielding layer and the first inner conductive layer;
a second conductive via including a second inner conductive layer, the second inner conductive via disposed on a sidewall of a second through hole in the substrate; and
a metal layer disposed on a surface of the substrate, the metal layer covering the second conductive via and contacting the shielding layer of the first conductive via and the second inner conductive layer of the second conductive via.

11. The semiconductor device of claim 10, wherein the first inner conductive layer and the shielding layer are ring structures substantially coaxial to the central axis of the first through hole.

12. The semiconductor device of claim 10, wherein the first inner conductive layer surrounds a central portion.

13. The semiconductor device of claim 10, further comprising:
a second metal layer, disposed on a second surface of the substrate and contacting the shielding layer.

14. The semiconductor of claim 10, further comprising:
a passivation layer, disposed on the metal layer and having a first opening to expose the first inner conductive layer and a second opening to expose part of the metal layer; and
a redistribution layer including a first redistribution portion and a second redistribution portion, the first redistribution portion, disposed in the first opening of the passivation layer so as to contact the first inner conductive layer and the second redistribution portion disposed in the second opening of the passivation layer so as to contact the metal layer.

* * * * *